(12) United States Patent
Ikeda (10) Patent No.: US 6,426,299 B1
(45) Date of Patent: Jul. 30, 2002

(54) METHOD AND APPARATUS FOR MANUFACTURING SEMICONDUCTOR DEVICE

(75) Inventor: Masayoshi Ikeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/716,209

(22) Filed: Nov. 21, 2000

(30) Foreign Application Priority Data

Nov. 26, 1999 (JP) ............................................. 11-336456

(51) Int. Cl.7 ..................... H01L 21/311; H01L 21/302; H01L 21/461
(52) U.S. Cl. ..................... 438/700; 438/706; 438/734
(58) Field of Search ................................. 438/734, 729, 438/730, 733, 735, 737, 622, 700, 704, 706

(56) References Cited

U.S. PATENT DOCUMENTS 5,445,710 A * 8/1995 Hori et al. ................ 156/643.1
5,681,780 A    10/1997 Mihara et al.
5,968,374 A    10/1999 Bullock
6,218,309 B1 *  4/2001 Miller et al. .................. 438/700

FOREIGN PATENT DOCUMENTS

JP         6-177092        6/1994

* cited by examiner

*Primary Examiner*—David Nelms
*Assistant Examiner*—Thao Phuong Le
(74) *Attorney, Agent, or Firm*—Sughrue Mion, PLLC (57) ABSTRACT

A second interlayer film is etched by an etching gas including fluorocarbon gas after a switch box is switched so that high frequency electricity is applied to an upper electrode. Then, the switch box is switched so that low power electricity is applied only to a lower-electrode/wafer-holder to generate plasma with using only fluorocarbon gas. The generated plasma etches a first interlayer film, and fluorine radicals dissociated from the fluorocarbon removes a hardened resist surface layer. It realizes etching with less damage on bases, because energy of incident ions is low.

19 Claims, 7 Drawing Sheets

METHOD AND APPARATUS FOR MANUFACTURING SEMICONDUCTOR DEVICE

BACKGROUND OF THE INVENTION

1. Field of the Invention

The present invention relates to a method for manufacturing a semiconductor device, more particularly to a method for manufacturing a semiconductor device with removing a hardened layer on a resist surface with reducing damages on a base layer.

2. Description of the Related Art

As semiconductor devices become highly integrated to have higher performance, dry etching technologies for fine processing on various materials are also required to be more improved. The semiconductor manufacturing industry is required to produce various types but less lots such as ASIC (Application Specified IC). Under such the situation, single wafer dry etchers have been the mainstream instead of batch loades dry etchers. The single wafer dry etcher, however, is required to improve etching rate per wafer, in order to realize the same output as the batch loades dry etcher. For the etching rate improvement, the single wafer dry ether performs etching under gained incident energy of reactive species.

As the incident energy of the reactive species is highly gained, a resist surface is exposed to highly energized ions or electrons. As a result, the resist surface is hardened, and a hardened surface layer may appears. Such the resist having the hardened surface layer may be ashed incompletely at a later step. Or, the hardened surface layer may be scattered to form particles. Those will deteriorate yielding of a semiconductor device.

Moreover, since highly energized ions are implanted into a base layer, the base layer is damaged, thus, a damaged layer may appear on the base layer surface. The damaged layer will also deteriorate the device characteristics of the semiconductor device.

Figure 6A:
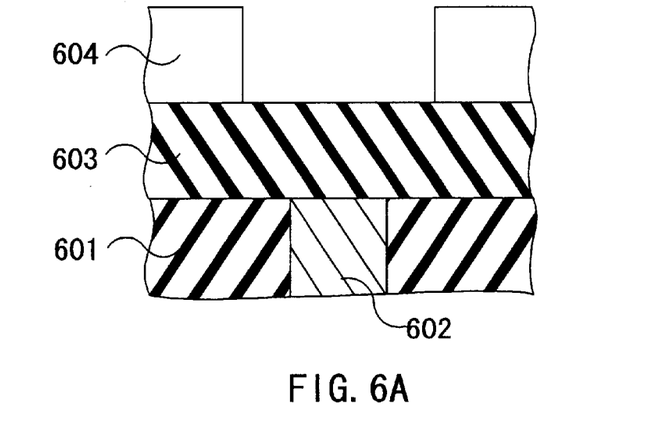
FIGS. 6A to 6C are cross sectional views for explaining conventional manufacturing steps of a semiconductor device.
Figure 6B:
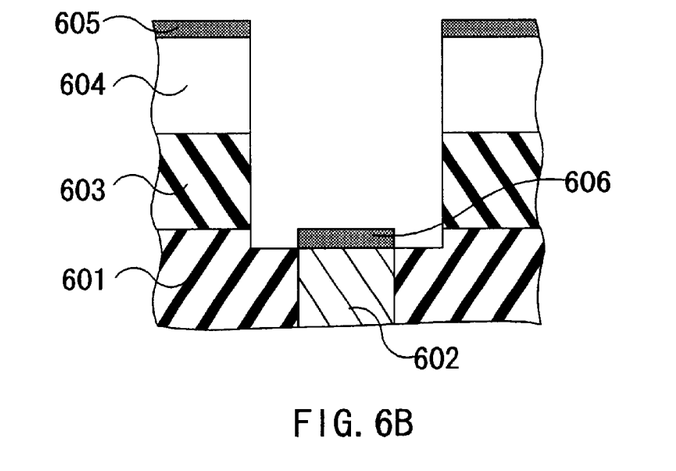

The problems in the etching with highly energized active species will now be described with reference to FIGS. 6A to 6C. As shown in FIG. 6A, a semiconductor wafer to be processed has a base layer 601 in which plugs 602 (base) are formed, an interlayer film formed on the base layer, and a resist 604 formed on the interlayer film 603 as an etching mask.

The surface of the resist 604 is exposed to highly energized ions or electrons through this process. As a result, the surface of the resist 604 is hardened, thus a hardened resist surface layer 605 is formed as shown in FIG. 6B. When highly energized ions are implanted into the plug 602, the surface of the plug 602 is damaged by the ion implantation, thus a damaged layer 606 is formed as shown in FIG. 6B.

Figure 6C:
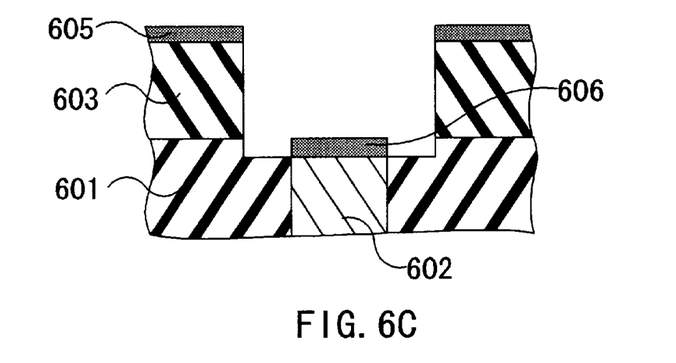

Thus formed hardened resist surface layer 605 and damaged layer 606 are remained after ashing, as shown in FIG. 6C. Such the residues should be removed because they will deteriorate performance of the semiconductor device.

The hardened resist surface layer 605 and the damaged layer 606 are removable at removing steps prepared for each. However, such the additional steps may cause throughput deterioration or cost increase. Unexamined Japanese Patent Application KOKAI Publication No. H6-177092 discloses a method for removing the hardened resist surface layer 605 or the damaged layer 606 without the throughput deterioration or cost increase caused by increased number of steps. The disclosed method utilizes a plasma generation gas including $O_2$ (oxygen) for the removing.

In this method, an ECR (Electron Cyclotron Resonance) plasma etcher etches a silicon compound layer with using an etching gas including fluorocarbons, and introduces $O_2$ after the etching to generate ECR plasma. A hardened resist surface layer and a damaged layer are removed by oxygen (O) radical which appears during plasma generation, or fluorine (F) radical which is generated by reaction of residual gas with $O_2$. RF (Radio Frequency) bias are applied to the hardened resist surface layer and the damaged layer during the etching, and the RF bias is cut off after the etching, thus, the hardened resist surface layer and the damaged layer are removed. That is, the RF bias is cut off to lower the energy of the active species such as ions. As a result, the hardened resist surface layer and the damaged layer are removed without etching the silicon compound layer excessively.

This method is applicable to an ECR plasma etcher or the like which carries out ashing at every processing per substrate, however, it is not suitable for a parallel plate plasma etcher with upper electrodes made of silicon (Si).

Figure 7:
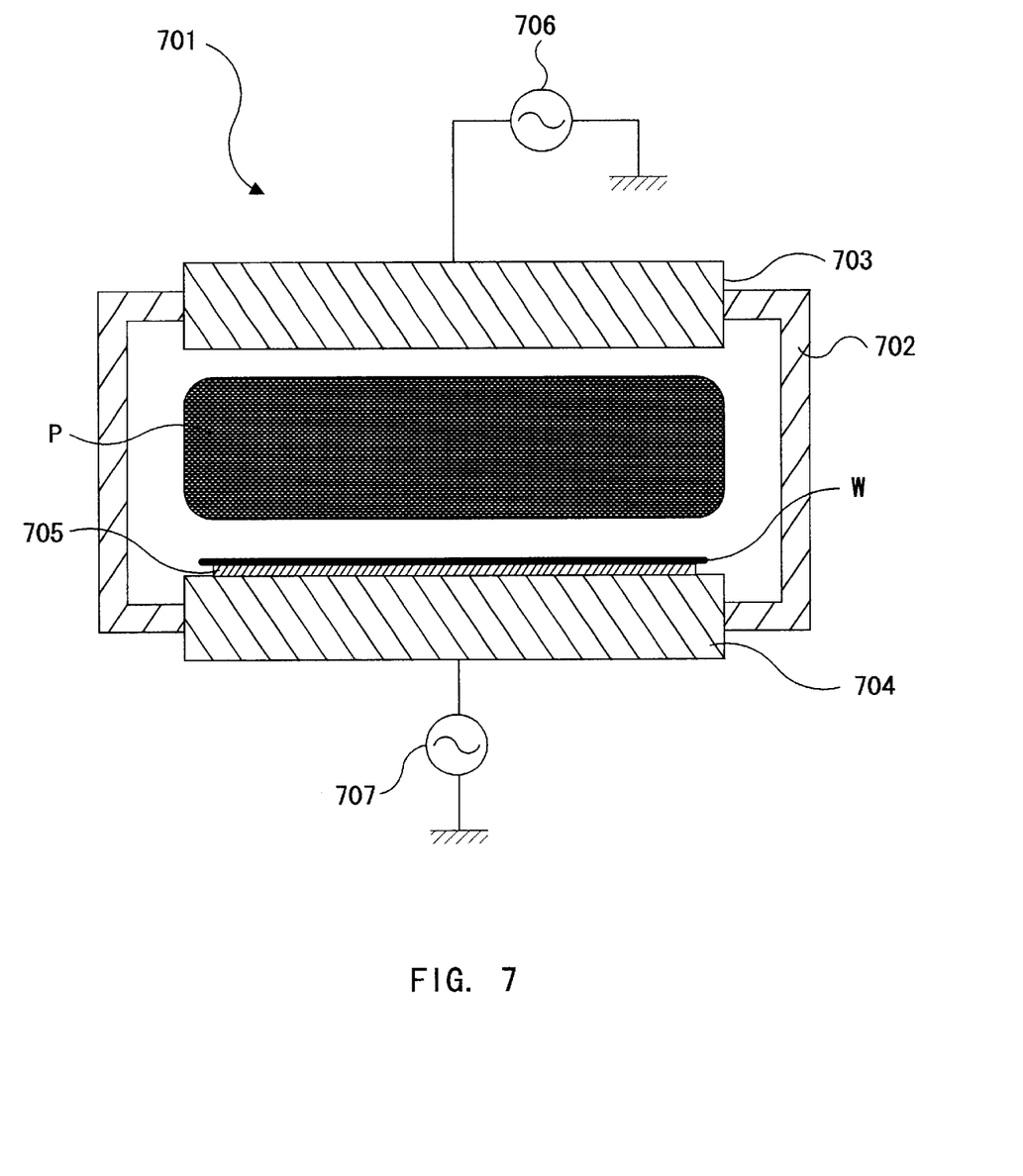
FIG. 7 is a diagram showing the structure of a conventional parallel plate etcher.

FIG. 7 shows a parallel plate plasma etcher 701. The etcher 701 comprises an etching chamber 702 which houses a pair of parallel plate electrodes of an upper electrode 703 and a lower-electrode/wafer-holder 704. With an electrostatic attractive stage 705, a target wafer W is attracted to the lower-electrode/wafer-holder 704. High frequency electricity is supplied to the upper electrode 703 and the lower-electrode/wafer-holder 704 from high frequency power sources 706 (for the upper electrode) and 707 (for lower electrode) respectively. The power supply generates high density plasma P for the etching.

In a case where a silicon oxide ($SiO_x$) film is etched by fluorocarbons in the above described parallel plate plasma etcher 701, the high density plasma helps dissociate the fluorocarbons, thus, generation of the mass of F radicals often occurs. The excessively generated F radicals decrease selective ratio of the $SiO_x$ film to Si compound other than the $SiO_x$ film, or to the resist. It is undesirable for fine etching. To reduce the excessively generated F radicals, the upper electrode 703 is made of Si, which has high reactivity for F radicals. That is, the excessively generated F radicals are trapped by Si of the upper electrode so that F radicals are reduced.

As aforementioned, the high frequency electricity is applied to the upper electrode 703. In a case where the upper electrode 703 is made of Si, active etching species collide with the upper electrode 703, thus the upper electrode 703 is sputtered. As a result, Si atoms often spring out from the upper electrode 703 toward the resist surface. The Si atoms deposited on the resist surface may form a hardened resist surface layer.

As well as the case of the ECR plasma etcher, the hardened resist surface layer formed by the Si atoms are removable by ECR plasma which is generated by introduced $O_2$ following to cutting off the power supply to the upper electrode 703 and the lower-electrode/wafer-holder 704 after the $SiO_x$ film is etched. However, since the hardened resist surface layer is made of Si compound, it must be subjected to long time processing with O radical rich or F radical rich plasma, in order to remove the Si compound. Moreover, elongation of plasma exposing period causes isotropic etching on the $SiO_x$ film. As a result, the etching profile of the $SiO_x$ film is deteriorated, and the base layer is damaged during the etching.

Not only the case of the above described parallel plate etcher employing Si upper electrode, but also any cases are undesirably affected by extra steps for removing the hardened resist surface layer and the damaged layer after interlayer etching steps. That is, the extra steps causes throughput deterioration and increase of facility costs. Moreover, interlayer films or a base layer may be etched undesirably.

SUMMARY OF THE INVENTION

The present invention has been made in consideration of the above problems, it is an object of the present invention to provide a method and an apparatus for manufacturing a semiconductor device which remove a hardened resist surface layer without causing throughput deterioration, facility cost increase, and damages on a base layer.

To achieve the above object, a method of manufacturing a semiconductor device according to the present invention comprises the steps of:

preparing a process target on which pattern of a resist is formed;

firstly etching the target with masking the target by the pattern of the resist with using a first etching gas; and secondarily etching the target with using a second etching gas instead of the first etching gas, and simultaneously removing a hardened layer formed on a surface of the resist during the first etching step.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

Figure 1:
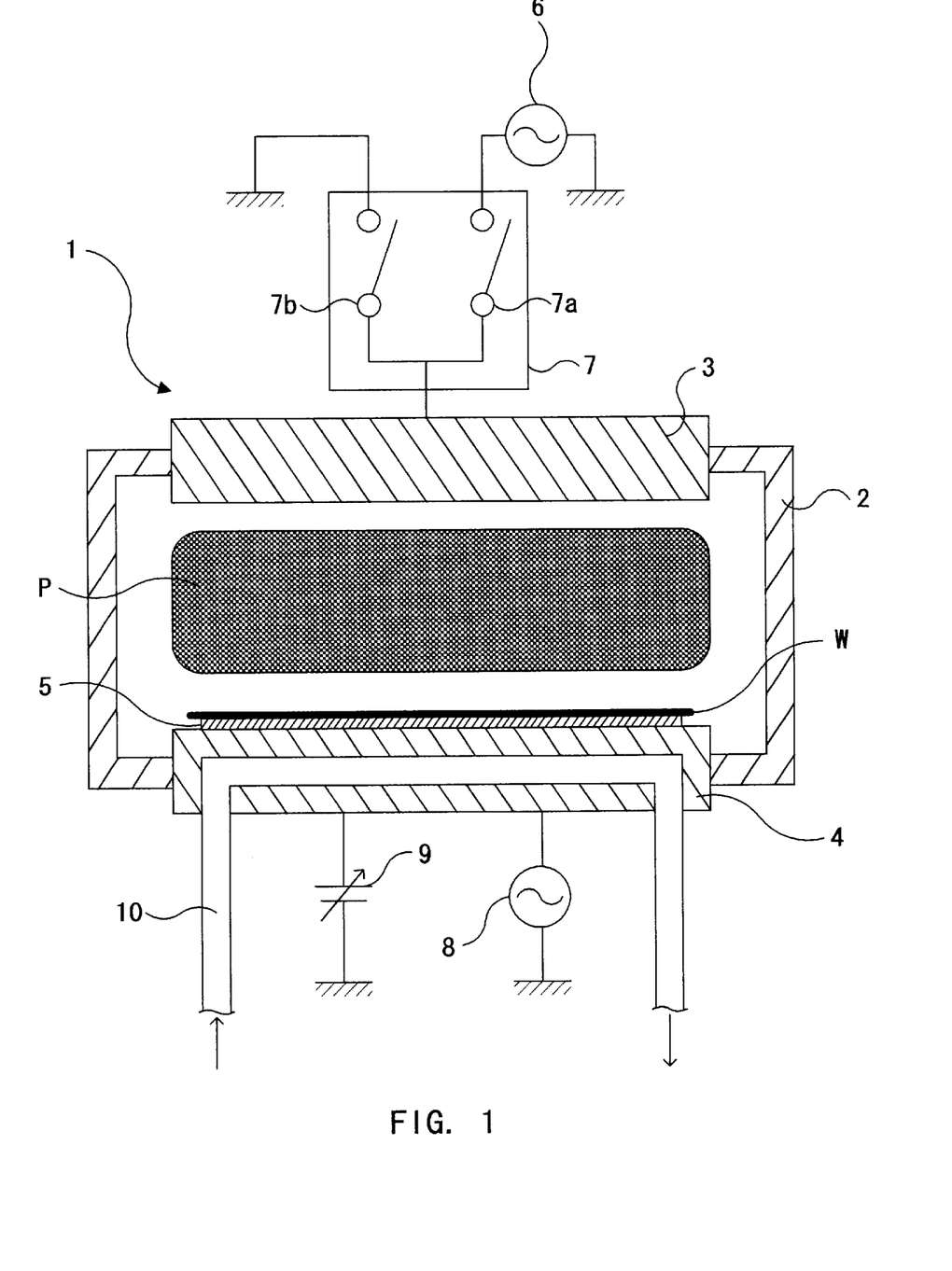
FIG. 1 is a diagram showing the structure of a parallel plate etcher according to a first embodiment of the present invention.
Figure 2:
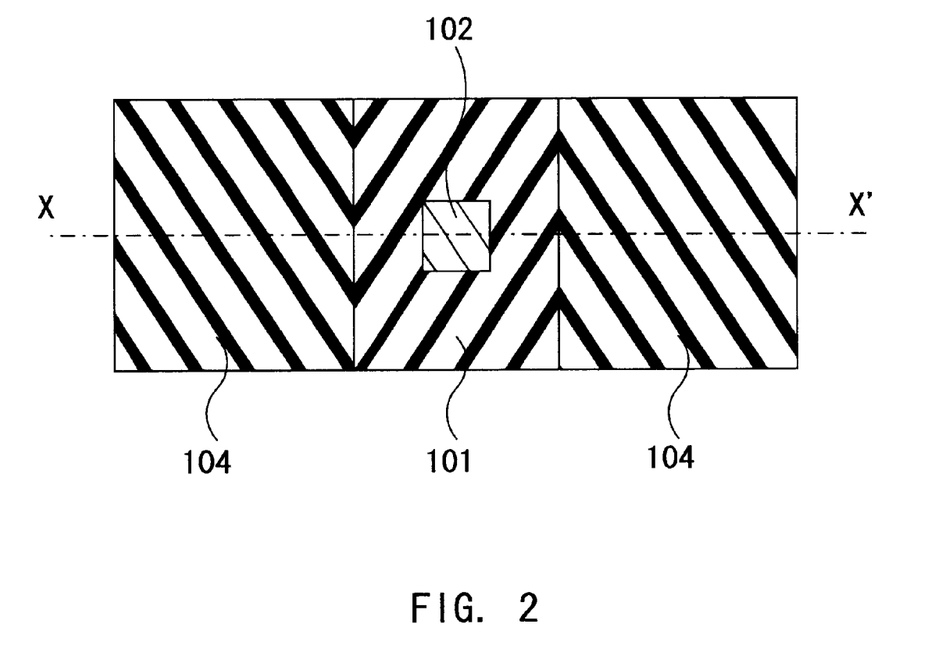
FIG. 2 is a top view showing a completed semiconductor device according to embodiments of the present invention.
Figure 3A:
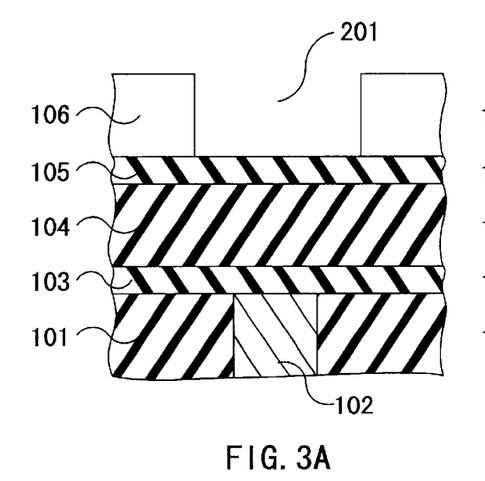
FIGS. 3A to 3D are cross sectional views for explaining manufacturing steps of the semiconductor device shown in FIG. 2 according to the first embodiment of the present invention.
Figure 3B:
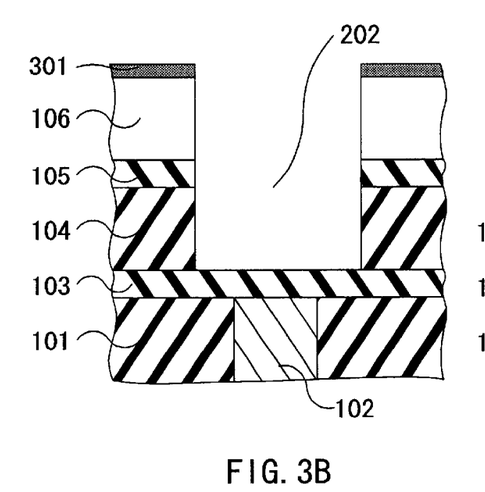

A first embodiment of the present invention will now be described with reference to FIGS. 1 to 4. FIG. 1 is a diagram showing a parallel plate etcher according to the first embodiment. FIG. 2 is a top view showing a completed semiconductor device according to the present invention. FIGS. 3A to 3D are cross sectional views along a line X–X' in FIG. 2 for explaining manufacturing steps of the semiconductor device. FIG. 4 is a diagram for explaining the manufacturing steps of the semiconductor device according to the first embodiment.

As shown in FIG. 1, a parallel plate etcher 1 according to the embodiments of the present invention comprises an etching chamber 2 which houses a pair of parallel plate electrodes having an upper electrode 3 and a lower-electrode/wafer-holder 4. A wafer W is attracted to an electrostatic attractive stage 5 on the lower-electrode/wafer-holder 4, thus, the lower-electrode/wafer-holder 4 substantially holds the wafer W. The upper electrode 3, which is made of Si, is connected to a high frequency power source 6 (for upper electrode) which supplies high frequency (for example, 2 MHz) electricity, and to a switch box 7. The switch box 7 includes switches 7a and 7b. The switch 7a connects/disconnects the upper electrode 3 to/from the high frequency power supply 6. The switch 7b connects/disconnects the upper electrode 3 to/from the ground. The lower-electrode/wafer-holder 4 is connected to a high frequency power source 8 (for lower electrode) which supplies high frequency (for example, 800 kHz) electricity, and to a DC power source 9 which applies high voltages to the lower-electrode/wafer-holder 4. A chiller path 10 is buried in the lower-electrode/wafer-holder 4. Chiller circulates in the chiller path 10 to control the temperature of the wafer W.

The etcher 1 according to this embodiment comprises a controller (not shown). The controller controls power supply, switching of the switch box 7, the temperature of the wafer W, and the like.

The structure of the wafer W employed in this embodiment will now be described with reference to FIGS. 2 and 3A–3D. A base layer 101 in which plugs 102 are formed is formed on a substrate. A first interlayer film 103 (p-SiON film) is formed on the base layer 101. A second interlayer film 104 (P-SiO$_2$ film) is formed on the first interlayer film 103. An organic anti-reflection film 105 is formed on the second interlayer film 104, and a resist 106 (as etching mask) is formed on the anti-reflection film 105. The anti-reflection film 105 prevents lights for developing the resist 106 during lithographing step from being reflected from a surface of the second interlayer film 104. Openings 201 are formed in the resist 106 by lithographing technique.

Steps of etching the wafer W (shown in FIG. 3A) by the parallel plate etcher 1 shown in FIG. 1 will now be described with reference to FIGS. 3A, 3B and 4.

A ventilator (not shown) vacuums the etching chamber 2, and the wafer W is placed on the electrostatic attractive stage 5.

Then, a step for etching the anti-reflection film is executed (see FIG. 4). A mixture gas of C$_4$F$_8$ (perfluorocyclobutane), Ar (argon), O$_2$ (oxygen), and CO (carbon oxide) whose mixture ratio is 4:550:13:40 (sccm), is supplied to the etching chamber 2. A pressure controller (not shown) keeps the pressure in the etching chamber 2 at 4.7 Pa.

When the pressure in the etching chamber 2 reaches 4.7 Pa and being stable, the controller controls the switch box 7 so as to turn on the switch 7a (connected) while turn off the switch 7b (disconnected). The power source 6 supplies electricity of 1,600 W to the upper electrode 3 and another power source 8 supplies electricity of 100 W to the lower-electrode/wafer-holder 4, thus plasma P is generated in the etching chamber 2 (see FIG. 1). The generated plasma P etches the anti-reflection film 105.

Since the electricity being supplied to the lower-electrode/wafer-holder 4 (100 W) is lower than that being supplied to the upper electrode 3, energy of incident ions upon the surface of wafer W is low. Therefore, the anti-reflection film 105 is selectively etched while the shape of the resist 106 is unchanged.

After the anti-reflection film 105 is etched, power supplies to the upper electrode 3 and the lower-electrode/wafer-holder 4 are cut off. Further, the etching gas supply is also cut off. Then the ventilator (not shown) spews out the etching gas in the etching chamber 2, and the anti-reflection film etching step is completed.

Then, a step for etching the second interlayer film starts (see FIG. 4). Another mixture gas of $C_4F_8$, Ar, $O_2$ and CO whose mixture ratio is 18:450:13:40 (sccm) is supplied to the etching chamber 2. The pressure controller (not shown) keeps the pressure in the etching chamber 2 at 4.7 Pa.

The power source 6 supplies electricity of 1,600 W to the upper electrode 3 and another power source 8 supplies electricity of 1,400 W to the lower-electrode/wafer-holder 4, while the switch box 7 is being unchanged (switch 7a: connected, switch 7b: disconnected). The power supplied causes generation of the plasma P which etches the second interlayer film 104.

During the steps of etching the anti-reflection film 105 and the second interlayer film 104, the upper electrode 3 is sputtered by the etching active species when the high frequency electricity is supplied to the upper electrode 3. As a result, the upper electrode 3 which is made of Si emits Si atoms. The emitted Si atoms are deposited onto the surface of the resist 106. The deposited Si atoms harden the surface of the resist 106, thus a hardened resist surface layer 301 is formed as shown in FIG. 3B.

Then, another step for etching the first interlayer film 103 starts (see FIG. 4). The power supplies to the upper electrode 3 and the lower-electrode/wafer-holder 4, and the etching gas supply are cut off. Then the ventilator (not shown) spews out the etching gas in the etching chamber 2.

Another etching gas ($CF_4$: 60 sccm) is supplied to is then supplied to the etching chamber 2, and the pressure controller (not shown) keeps the pressure in the etching chamber 2 at 5.3 Pa.

The controller controls the switch box 7 so as to turn off the switch 7a (disconnected) and turn on the switch 7b (connected), thus the upper electrode 3 is grounded. The power source 8 supplies electricity of 200 W which is lower than that for etching the second interlayer film 104 to the lower-electrode/wafer-holder 4. The power supply causes the generation of the plasma P in the etching chamber 2 which etches the first interlayer film 103.

In the plasma P, the etching gas ($CF_4$) is being dissociated and F radicals are generated. The generated F radicals and Si of the hardened resist surface layer 301 are, bonded to each other. As a result, the hardened resist surface layer 301 is removed.

Accordingly, the plasma P generated in the etching chamber 2 etches the first interlayer film 103, and the F radicals in the plasma P removes the hardened resist surface layer 301.

Since relatively lower electricity is supplied to the lower-electrode/wafer-holder 4, energy of incident ions upon the surface of the wafer W is low. It prevents the isotropic etching on the first interlayer film 103. Therefore, the plugs 102 will not be damaged even if they are exposed after the first interlayer film 103 is etched.

Moreover, since high frequency electricity is no longer supplied to the upper electrode 3, capability of Si atom emission from the upper electrode 3 caused by the sputtering is less than that during the steps of etching the anti-reflection film 105 and the second interlayer film 104. The reduction of the Si atoms prevents a hardened material of Si compound from being formed on the surface of the resist 106.

Figure 3C:
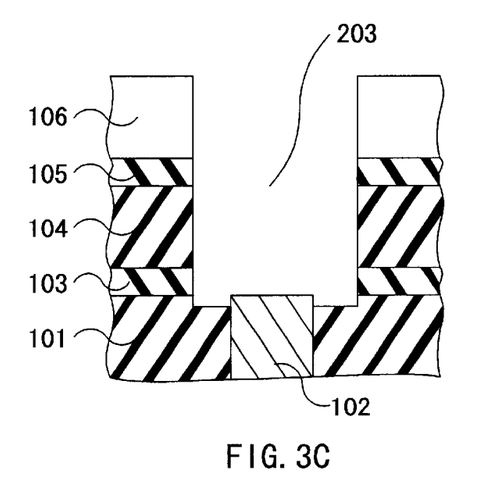
Figure 3D:
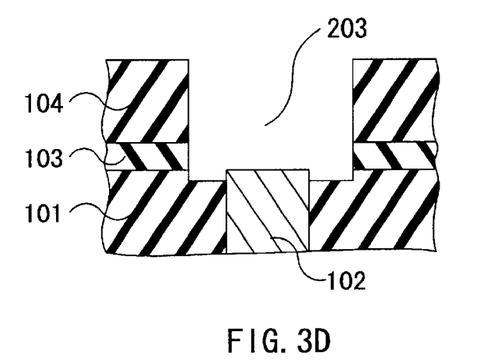
Figure 4:
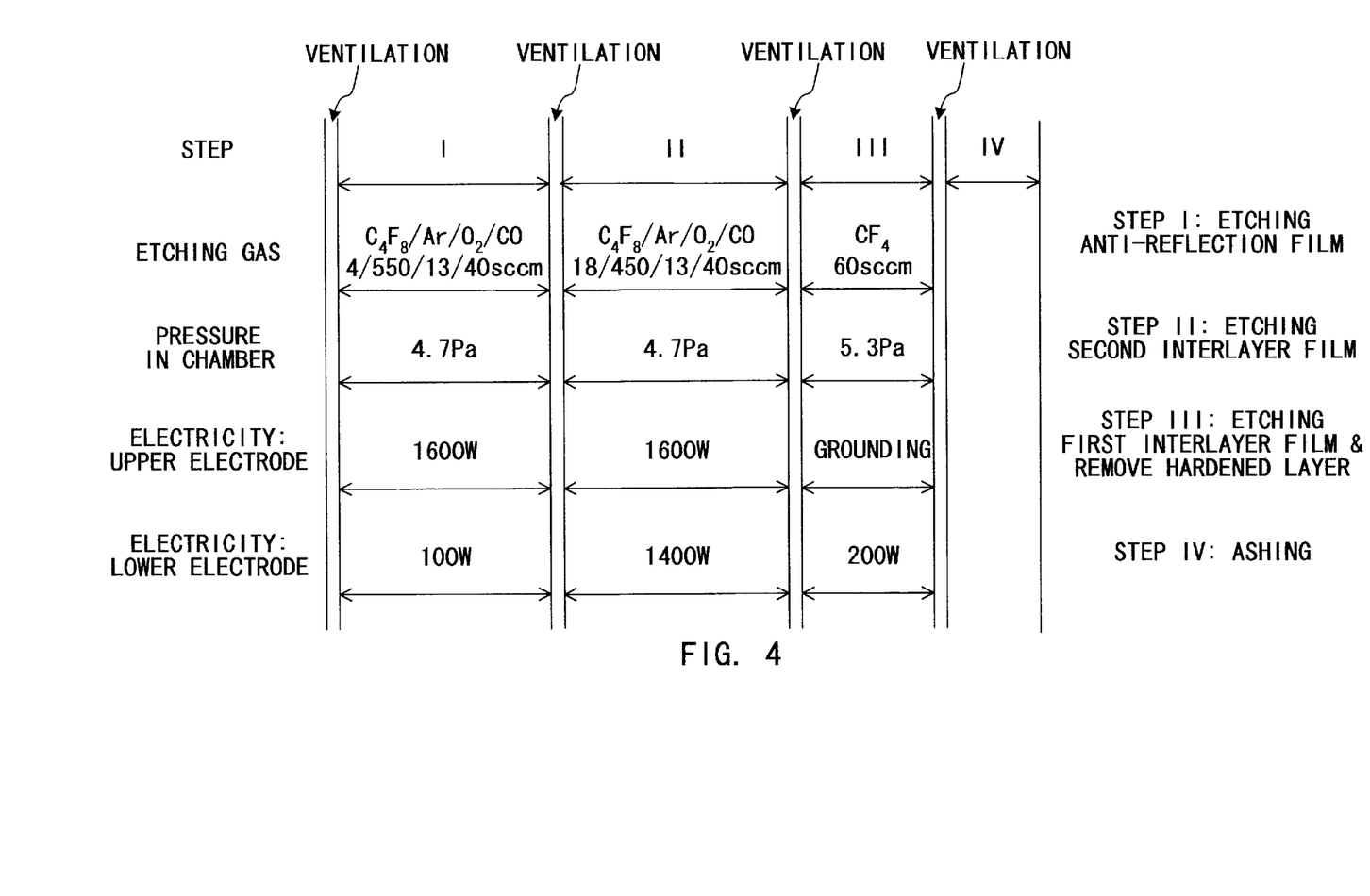
FIG. 4 is a diagram for explaining manufacturing steps of the semiconductor device according to the first embodiment of the present invention.

Finally, the wafer W under the situation shown in FIG. 3C is loaded into an ashing chamber of a microwave discharge plasma ashing apparatus. Process gas including $O_2$ is supplied to the ashing chamber to generate $O_2$ plasma which ashes the resist 106 and the anti-reflection film 105. As a result, the resist 106 and the anti-reflection film 105 are removed as shown in FIG. 3D, and a wiring groove 203 is formed.

According to the first embodiment as described above, it is able to remove the hardened resist surface layer 301, while the first interlayer film 103 is etched by supplying the fluorocarbon etching gas, grounding the upper electrode 3, and supplying low power electricity only to the lower-electrode/wafer-holder 4. Moreover, generation of Si compound on the surface of the resist 106 is restricted during the step of etching the first interlayer film 103, with less damages on the plugs 102.

Second Embodiment

Figure 5:
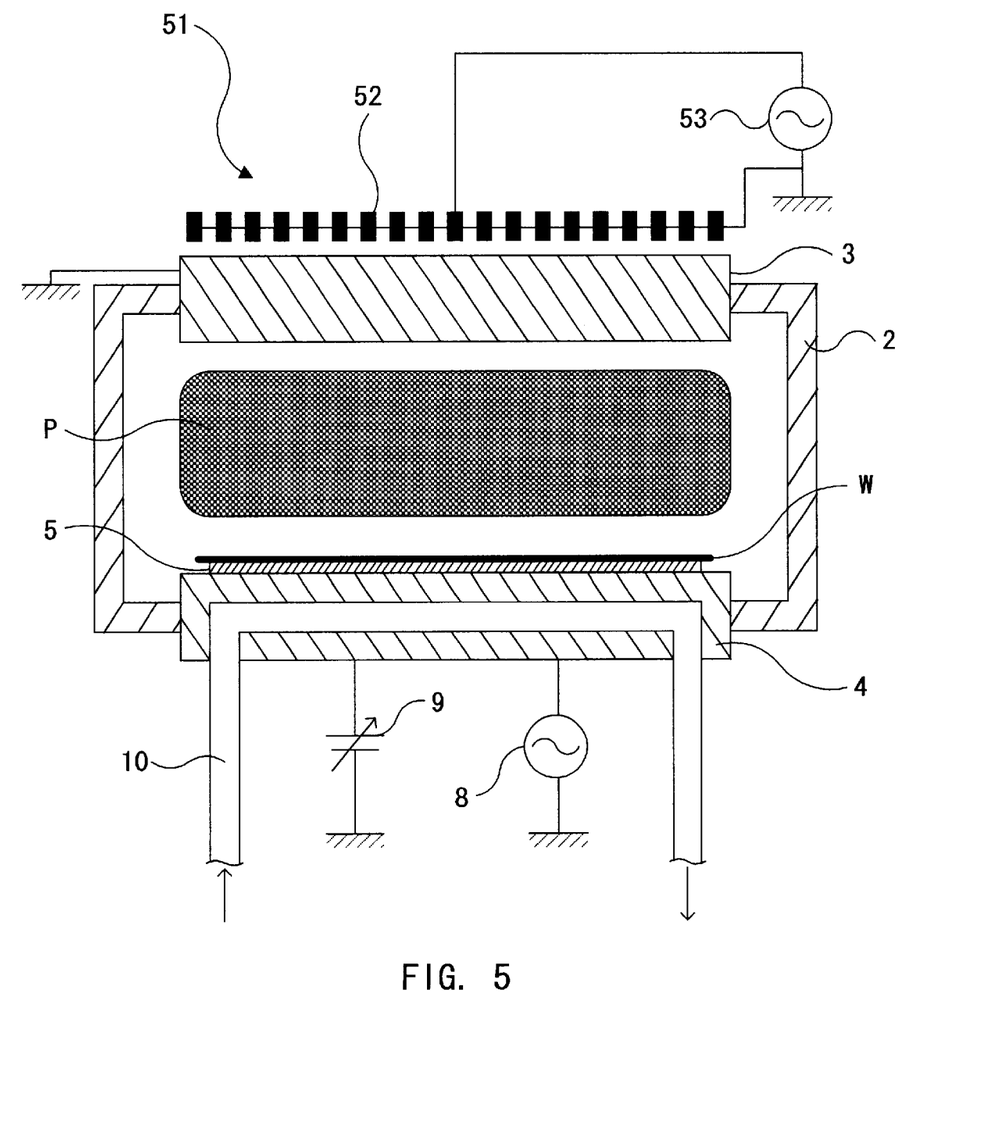
FIG. 5 is a diagram showing the structure of a parallel plate etcher according to a second embodiment of the present invention.

A second embodiment of the present invention will now be described with reference to FIGS. 4 and 5. FIG. 5 is a diagram showing a parallel plate etcher 51 according to the second embodiment. Like or the same reference symbols as used in FIG. 1 are also used in FIG. 5 to denote corresponding or identical components.

In the etcher 51 shown in FIG. 5, high frequency electricity is supplied to the lower-electrode/wafer-holder 4 and a coil electrode 52 above the upper electrode 3, to generate high density plasma P in the etching chamber 2 for etching the wafer W. A high frequency power source 53 (for coil electrode) supplies high frequency electricity (for example, 2 MHz) to the coil electrode 52, and another high frequency power source 8 (for lower-electrode/wafer-holder) supplies high frequency electricity (for example, 800 kHz) to the lower-electrode/wafer-holder 4. The upper electrode 3, which is made of Si, is grounded. The electrostatic attractive stage 5 on the lower-electrode/wafer-holder 4 attracts the wafer W, thus the lower-electrode/wafer-holder 4 substantially holds the wafer W thereon.

A step of etching the wafer W under the situation shown in FIG. 3A by the etcher 51 shown in FIG. 5 will now be described. First, the ventilator (not shown) vacuums the etching chamber 2, and the wafer W is placed on the electrostatic attractive stage 5.

A gas supplier (not shown) supplies a mixture gas of $C_4F_8$, Ar, $O_2$ and CO whose mixture ratio is 4:550:13:40 (sccm) to the etching chamber 2. The pressure controller (not shown) keeps the pressure in the etching chamber 2 at 4.7 Pa. The pressure in the etching chamber 2 reaches 4.7 Pa and being stable, the power source 53 supplies electricity of 1,600 W to the coil electrode 52, and another power source 8 supplies electricity of 100 W to the lower-electrode/wafer-holder 4, thus plasma P is generated in the etching chamber 2. The generated plasma P etches the anti-reflection film 105.

Since the electricity being supplied to the lower-electrode/wafer-holder 4 (100 W) is lower than that being supplied to the coil electrode 52, energy of incident ions upon the surface of the wafer W is low. Therefore, the anti-reflection film 105 is selectively etched while the shape of the resist 106 is unchanged.

After the anti-reflection film 105 is etched, the power supplies to the coil electrode 52 and the lower-electrode/wafer-holder 4 are cut off. Further, the etching gas supply to the etching chamber 2 is also cut off. The ventilator (not shown) spews out the etching gas in the etching chamber 2.

Another mixture gas of $C_4F_8$, Ar, $O_2$ and CO whose mixture ratio is 18:450:13:40 (sccm) is supplied to the etching chamber 2, and the pressure in the etching chamber 2 is kept at 4.7 Pa.

Then, the power source 53 supplies electricity of 1,600 W to the coil electrode 52, and another power source 8 supplies electricity of 1,400 W to the lower-electrode/wafer-holder 4, to generate the plasma P which etches the second interlayer film 104.

During the etching carried out in the etcher 51 shown in FIG. 5, the high frequency electricity being supplied to the coil electrode 52 invokes potential difference between the plasma P and the upper electrode 3. Therefore, the upper electrode 3 which is being grounded is sputtered by active species in the plasma P. As a result, the upper electrode 3 emits Si atoms, and those are deposited onto the surface of the resist 106. The deposited Si atoms form the hardened resist surface layer 301 as shown in FIG. 3B.

After the second interlayer film 104 is etched, the power supply to the coil electrode 52 and the etching gas supply are cut off, and residual gas is spewed out. Then, another etching gas ($CF_4$: 60 sccm) is supplied to the etching chamber 2, and the pressure in the etching chamber 2 is kept at 5.3 Pa. The electricity of 200 W which is lower than that for etching the second interlayer film 104 is supplied to the lower-electrode/wafer-holder 4. Thus, the plasma P is generated in the etching chamber 2 which etches the first interlayer film 103.

The generated plasma P dissociates the etching gas ($CF_4$), and F radicals are generated. The generated F radicals and Si of the hardened resist surface layer 301 are bonded to each other. As a result, the hardened resist surface layer 301 is removed.

Accordingly, it is able to remove the hardened resist surface layer 301 at the same time as the first interlayer film 103 is being etched as shown in FIG. 3C. Moreover, since relatively lower electricity is supplied to the lower-electrode/wafer-holder 4, energy of incident ions upon the surface of the wafer W is low. It prevents isotropic etching on the first interlayer film 103. Further, the plugs 102 will be seldom damaged even if they are exposed after the first interlayer film 103 is etched.

Since no high frequency electricity is supplied to the coil electrode 52, invoked potential difference between the plasma P and the upper electrode 3 is small. Therefore, the sputtering of the Si of the upper electrode 3 is controlled in a low level. It prevents a hardened layer from being formed on the surface of the resist 106.

Finally, the resist 106 and the anti-reflection film 105 are ashed by $O_2$ plasma which is generated in the microwave discharge plasma ashing apparatus with supplying process gas including $O_2$ thereto. As a result, the resist 106 and the anti-reflection film 105 are removed, and the wiring groove 203 is formed.

According to the second embodiment as described above, it is able to carry out simultaneous processing of etching the first interlayer film 103 and removing the hardened resist surface layer 301, even in a case where active species in the plasma P sputters Si of the upper electrode 3 when high frequency electricity is not supplied directly to the upper electrode 3. This feature is realized by supplying fluorocarbon gas to the etching chamber 2 and supplying low power electricity only to the lower-electrode/wafer-holder 4, after the second interlayer film 104 is etched. Moreover, it prevents Si compound from being formed on the surface of the resist 106 during the step of etching the first interlayer film 103. Further, the damages for the plugs 102 are reduced.

In the above embodiments, it is described the process for forming the wiring groove, however, the present invention is applicable to cases for etching an insulation film with using a resist as an etching mask, for example, forming holes (contact holes, via contacts) or hardmask etching. Moreover, the present invention is effective in protecting bases (diffusion layer, wiring, plug, etc.) from being exposed directly to plasma during etching insulation films.

In the above embodiments, a sole etcher performs whole processing from etching the anti-reflection film 105 to etching the first interlayer film 103 with removing the hardened resist surface layer 301, however, a plurality of etchers may be prepared for each layer to perform etching and removing. For example, the steps of etching the anti-reflection film 105 and the second interlayer film 104 shown in FIGS. 3A and 3B may be executed in a conventional parallel plate etcher, and the steps of etching the first interlayer film 103 and removing the hardened resist surface layer 301 shown in FIGS. 3C and 3D may be executed in the etcher featured in the first or second embodiment.

In the above embodiments, the cases where the wafer has two interlayer films (first and second) have been described, however, the present invention is applicable to a case where the wafer has a single interlayer film. In this case, the followings are carried out during etching an interlayer film: using only fluorocarbon as the etching gas; cutting off power supply to the upper electrode 3 or coil electrode 52; and supplying low power electricity only to the lower-electrode/wafer-holder 4. Such the condition alteration during the etching realizes simultaneous processing of etching the residual interlayer film and removing a hardened resist surface layer.

In the above embodiments, the first interlayer film is made of p-SiON, and the second interlayer film is made of p-SiO$_2$, however, any insulation films whose material are other than p-SiON and p-SiO$_2$ are applicable.

Instead of grounding the upper electrode 3 as described in the above embodiments, supplying low power electricity to the upper electrode 3 also brings the similar effects.

Applicable etcher is not limited to the parallel plate etcher employing Si upper electrode. For example, the present invention is applicable to an etcher which comprises any parts including Si in an etching chamber wherein high frequency electricity or high voltage is applied to those parts. The present invention is also applicable to a case where active species in plasma generated during etching sputter Si, thus a hardened resist surface layer which is mainly made of Si is formed on a surface of a resist, even if high frequency electricity or high voltage is not supplied to the Si parts.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. H11-336456 filed on Nov. 26, 1999 and including specification, claims, drawings and summary. The disclosure of the above Japanese Patent Application is incorporated herein by reference in its entirety.

What is claimed is:

1. A method of manufacturing a semiconductor device comprising the steps of:

preparing a process target on which pattern of a resist is formed;

firstly etching said target with masking said target by the pattern of said resist with using a first etching gas; and secondarily etching said target with using a second etching gas instead of said first etching gas, and simultaneously removing a hardened layer formed on a surface of said resist during said first etching step.

2. The method according to claim 1, wherein said first etching step comprises a step of dry etching said target with plasma generated from said first etching gas, and simultaneously hardening the surface of said resist, and said second etching step comprises a step of etching said target with using said second etching gas, and simultaneously removing the hardened layer which is formed on the surface of said resist during said first etching step.

3. The method according to claim 1, wherein said first etching step comprises a step of applying high frequency electricity to said first etching gas, and said second etching step comprises a step of applying electricity to said second etching gas, said electricity is lower than the electricity applied to said first etching gas during said first etching step.

4. The method according to claim 1, wherein said first etching step applies the high frequency electricity to said first etching gas via an electrode including silicon, and forms said hardened layer by silicon which is sputtered and emitted from said electrode.

5. The method according to claim 1, wherein said target comprises at least first and second layers, wherein said first layer is etched at said first etching step, and said second layer is etched at said second etching step.

6. The method according to claim 1, wherein said first and second etching gases comprise gases including fluorine.

7. The method according to claim 1 further comprising the step of ashing said resist.

8. A method of manufacturing a semiconductor device comprising:

placing a process target on which pattern of a resist is formed, in a process room being comprised of a first electrode including silicon and a second electrode facing said first electrode, so that said resist faces said first electrode;

supplying a first etching gas to said process room;

firstly etching said target by plasma generated from said first etching gas by applying energy to said first etching gas via said first electrode and second electrode;

supplying a second etching gas to said process room; and secondarily etching said target by plasma generated from said second etching gas by applying energy to said second etching gas via said first electrode and second electrode, and simultaneously removing a hardened layer which is formed on a surface of said resist.

9. The method according to claim 8, wherein said first etching step applies first energy to said first etching gas via said first electrode, thus particles in said plasma collide with said first electrode, the collision causes said first electrode to emit silicon atoms, and the emitted silicon atoms reacts with said resist, thus said hardened layer is formed, and said second etching step applies second energy which is lower than said first energy, to said second etching gas via said first electrode.

10. The method according to claim 8, wherein said first etching step applies a high frequency voltage directly or indirectly to said first electrode, and said second etching step applies a reference voltage to said first electrode without applying a high frequency voltage thereto.

11. The method according to claim 8, wherein said first etching step includes:

a first step of supplying first electricity to an upper electrode and applies second electricity which is lower than said first electricity to a lower electrode; and a second step of supplying said first electricity to said upper electrode, and applying third electricity which is larger than said second electricity to said lower electrode, and said second etching process applies fourth electricity which is lower than said third electricity to said lower electrode.

12. The method according to claim 8, wherein said second etching gas mainly comprises fluorocarbon.

13. The method according to claim 8 further comprising the step of removing said resist by ashing.

14. An apparatus for manufacturing a semiconductor device comprising:

a first electrode including silicon;

a second electrode facing said first electrode; and a gas supplier which supplies process gas to a process room determined by said first electrode and said second electrode, wherein said gas supplier supplies a first etching gas to said process room, said first electrode and said second electrode apply energy to said first etching gas to generate plasma of said first etching gas for firstly etching a process target on which pattern of a resist which is placed between said first electrode and said second electrode, said gas supplier supplies a second etching gas to said process room, and said first electrode and said second electrode apply energy to said second etching gas to generate plasma of said second etching gas for secondarily etching said target, and simultaneously removing a hardened layer formed on a surface of said resist.

15. The apparatus according to claim 14 further comprising:

a first power source which applies high frequency electricity and predetermined electricity to said first electrode; and a second power source which applies high frequency electricity to said second electrode, wherein said first power source applies the high frequency electricity to said first electrode for said first etching, and applies the predetermined electricity to said first electrode for said second etching, and said second power source supplies first high frequency electricity to said second electrode for said first etching, and applies second high frequency electricity which is lower than said first high frequency electricity to said second electrode for said second etching.

16. The apparatus according to claim 15, wherein said first power source applies first electricity to said first electrode for said first etching, and applies the predetermined electricity to said first electrode for said second etching, and said second power source firstly supplies second electricity which is lower than said first electricity to said second electrode and secondarily supplies third electricity which is larger than said second electricity to said second electrode for said first etching, and supplies fourth electricity which is lower than said third electricity to said second electrode for said second etching.

17. A method of manufacturing a semiconductor device, comprising the steps of:

placing a process target made of a first insulation layer, a second insulation layer, and a pattern of a resist deposited in this order in a process room determined by a first electrode including silicon, and a second electrode facing said first electrode, so that said resist faces said first electrode;

supplying a first etching gas to said process room;

firstly etching said second insulation layer selectively, using the pattern of said resist as a mask, by plasma generated by applying energy to said first etching gas via said first electrode and said second electrode;

supplying a second etching gas to said process room; and secondarily etching said first insulation layer selectively by plasma generated by applying energy to said second etching gas via said second electrode while fixing the voltage of said first electrode at a reference voltage, and simultaneously removing a hardened layer formed on a surface of said resist.

18. The method according to claim 17, wherein:

said first etching step comprises a step of applying first electricity to said first etching gas; and said second etching step comprises a step of applying second electricity which is lower than said first electricity to said second etching gas.

19. The method according to claim 17, wherein said first and said second etching gases include fluorine.

* * * * *